US009519105B1

(12) United States Patent
Shubin et al.

(10) Patent No.: US 9,519,105 B1
(45) Date of Patent: Dec. 13, 2016

(54) SELF-ASSEMBLED VERTICALLY ALIGNED MULTI-CHIP MODULE

(71) Applicant: Oracle International Corporation, Redwood City, CA (US)

(72) Inventors: Ivan Shubin, San Diego, CA (US); Xuezhe Zheng, San Diego, CA (US); Jin Hyoung Lee, San Diego, CA (US); Kannan Raj, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/188,403

(22) Filed: Jun. 21, 2016

Related U.S. Application Data

(62) Division of application No. 14/823,962, filed on Aug. 11, 2015.

(51) Int. Cl.
*G02B 6/26* (2006.01)
*G02B 6/13* (2006.01)
*G02B 6/42* (2006.01)
*G02B 6/12* (2006.01)
*H01S 5/30* (2006.01)
*H01L 33/58* (2010.01)
*G02B 6/43* (2006.01)

(52) U.S. Cl.
CPC . *G02B 6/13* (2013.01); *G02B 6/12* (2013.01); *G02B 6/4228* (2013.01); *G02B 6/4257* (2013.01); *G02B 6/43* (2013.01); *H01L 33/58* (2013.01); *H01S 5/3013* (2013.01); *G02B 2006/12061* (2013.01)

(58) Field of Classification Search
CPC ........... G02B 6/12; G02B 6/13; G02B 6/4228; G02B 6/423; G02B 6/4239; G02B 6/4257; G02B 6/42; G02B 6/43; G02B 2006/12061; H01S 5/3013; H01S 5/50; H01L 33/58; G03F 7/0037; B29D 11/00663
USPC .............................................. 385/14, 50, 52
See application file for complete search history.

(56) References Cited

U.S. PATENT DOCUMENTS

2013/0209112 A1* 8/2013 Witzens ............... G02B 6/2813
398/214

* cited by examiner

*Primary Examiner* — Akm Enayet Ullah
*Assistant Examiner* — Michael Mooney
(74) *Attorney, Agent, or Firm* — Park, Vaughan, Fleming & Dowler LLP

(57) ABSTRACT

A multi-chip module (MCM) is described. This MCM includes two substrates that are passively self-assembled on another substrate using hydrophilic and hydrophobic materials on facing surfaces of the substrates and liquid surface tension as the restoring force. In particular, regions with a hydrophilic material on the two substrates overlap regions with the hydrophilic material on the other substrate. These regions on the other substrate may be surrounded by a region with a hydrophobic material. In addition, spacers on a surface of at least one of the two substrates may align optical waveguides disposed on the two substrates, so that the optical waveguides are coplanar. This fabrication technique may allow low-loss hybrid optical sources to be fabricated by edge coupling the two substrates. For example, a first of the two substrates may be a III/V compound semiconductor and a second of the two substrates may be a silicon-on-insulator photonic chip.

17 Claims, 10 Drawing Sheets

SELF-ASSEMBLED VERTICALLY ALIGNED MULTI-CHIP MODULE

RELATED APPLICATIONS

This application is a divisional application of, and hereby claims priority under 35 U.S.C. §120 to, pending U.S. patent application Ser. No. 14/823,962, entitled "Self-Assembled Vertically Aligned Multi-Chip Module," by inventors Ivan Shubin, Xuezhe Zheng, Jin Hyoung Lee, Kannan Raj and Ashok V. Krishnamoorthy, which was filed on 11 Aug. 2015, and which is hereby incorporated by reference.

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure generally relates to multi-chip modules (MCMs) and techniques for fabricating MCMs. More specifically, the present disclosure relates to an MCM that includes two substrates that are vertically aligned using spacers and that are self-assembled using hydrophilic and hydrophobic layers.

Related Art

Optical interconnects based on silicon-photonics technology have the potential to outperform electrical interconnects in terms of bandwidth, component density, energy efficiency, latency, and physical reach. Consequently, optical interconnects are a promising solution to alleviate inter-chip and intra-chip communication bottlenecks in high-performance computing systems.

While tremendous progress has been made in developing silicon-on-insulator (SOI) circuits, light sources on silicon remain a substantial technological challenge. In particular, in order to make an efficient laser source on silicon, an efficient optical gain medium is needed. However, because of its indirect bandgap structure, silicon is usually a poor material for light emission. Although there are ongoing efforts to enhance the light-emitting efficiency and optical gain in silicon, an electrically pumped room-temperature continuous-wave (CW) laser in silicon remains elusive. Similarly, while there have been exciting developments in the use of germanium directly grown on silicon as the optical gain medium, high-tensile strain and high doping are typically needed to make germanium have a direct bandgap, which usually results in low laser efficiency. Furthermore, epitaxial growth of III/V compound semiconductors on silicon is often difficult because of the large lattice and thermal mismatches between silicon and the III/V compound semiconductors, which also limits laser efficiency and reliability. Thus, because of a number of material, process and device physics issues, these areas remain research topics.

An alternative near-term approach for building lasers on or using silicon is hybrid wafer integration of III/V compound semiconductors with silicon. For example, evanescent-coupled hybrid lasers have been successfully demonstrated by wafer bonding of indium-phosphide active structures to silicon via either oxide-to-oxide fusion bonding or polymer-enabled benzocyclobutene bonding. However, because of taper loss, carrier-injection efficiency and thermal impedance, these hybrid lasers typically have relatively low optical-waveguide-coupled overall efficiency. Furthermore, wafer-bonding approaches usually only work for direct bonding of III/V compound semiconductors on a silicon wafer with passive circuits. In addition, III/V compound-semiconductor wafers and SOI wafers often do not have compatible sizes. In particular, a III/V compound-semiconductor wafer size is usually limited to 150 mm, while typical SOI photonic wafer diameters are 200 mm and 300 mm. Consequently, integrating hybrid laser sources with other active silicon devices (which may include multiple layers of metal interconnects and interlayer dielectrics) remains a challenge.

Edge-to-edge butt-coupling of a III/V compound-semiconductor optical gain medium with silicon optical waveguides is a common hybrid integration approach. It allows the high electrical injection efficiency and low thermal impedance of conventional III/V compound-semiconductor lasers to be maintained. Moreover, using this approach, both the III/V compound-semiconductor optical gain media and the SOI circuits can be independently optimized for performance, and can be independently fabricated. External cavity (EC) lasers using this hybrid integration technique have been successfully demonstrated with high optical-waveguide-coupled overall efficiencies. However, because of the optical-mode mismatch between the III/V compound-semiconductor and the silicon optical waveguides, special mode size converters on either or both sides of the III/V compound semiconductor and silicon are often needed. In addition, in order to obtain efficient optical coupling, accurate alignment of the optical waveguides in the III/V compound semiconductor and the silicon with sub-micron alignment tolerances is typically needed. Addressing these problems can decrease the yield and increase the cost of these hybrid lasers.

Hence, what is needed is a hybrid optical source and a technique for fabricating a hybrid optical source without the problems described above.

SUMMARY

One embodiment of the present disclosure provides a multi-chip module (MCM). This MCM includes a first substrate having a first surface, where the first substrate includes a first optical waveguide disposed on the first substrate at a first height relative to the first surface. Moreover, the MCM includes a second substrate having a second surface. This second substrate includes: a second optical waveguide disposed on the second substrate at a second height relative to the second surface; and spacers, having a thickness, disposed on the second surface. Furthermore, the MCM includes a third substrate, having a third surface, mechanically coupled to the first surface and to the spacers, where the thickness of the spacers aligns the first optical waveguide and the second optical waveguide.

For example, the first height may equal a sum of the second height and the thickness of the spacers.

Note that the first substrate may include a semiconductor optical amplifier defined in a semiconductor other than silicon. Moreover, the second substrate may include a photonic chip. This photonic chip may include: the second substrate; a buried-oxide layer disposed on the second substrate; and a semiconductor layer disposed on the buried-oxide layer, wherein the second optical waveguide is defined in the semiconductor layer. In some embodiments, the second substrate, the buried-oxide layer and the semiconductor layer constitute a silicon-on-insulator technology.

Furthermore, back surfaces of the first substrate and the second substrate, which are on opposite sides of the first substrate and the second substrate from the first surface and the second surface, may include a hydrophilic material. Similarly, the first surface and the third surface may include facing regions with a hydrophilic material. Additionally, the third surface may include regions with a hydrophobic material that are outside of an area of overlap between the first surface and the third surface.

Note that the hydrophobic material may include: a fluoropolymer and/or parylene. Alternatively or additionally, the hydrophobic material may be fabricated using a plasma treatment with oxygen.

Moreover, the second surface and the third surface may include facing regions with the hydrophilic material. Additionally, the third surface may include regions with the hydrophobic material that are outside of an area of overlap between the second surface and the third surface.

In some embodiments, the MCM includes an epoxy layer between the area of overlap between the first surface and the third surface, and between an area of overlap between the second surface and the third surface. Furthermore, note that the spacers may include: a metal, a polymer and/or a resin.

Alternatively, the spacers may be disposed on the first surface, and the third surface of the third substrate may be mechanically coupled to the second surface and to the spacers.

Another embodiment provides a system that includes the MCM.

Another embodiment provides a method for fabricating the MCM. During the method, first regions are defined with a first hydrophilic material on the first surface of the first substrate, where the first substrate includes the first optical waveguide disposed on the first substrate at the first height relative to the first surface. Then, the spacers, which have the thickness, are disposed on the second surface of the second substrate, where the second substrate includes the second optical waveguide disposed on the second substrate at the second height relative to the second surface. Moreover, second regions with a second hydrophilic material are defined on the second surface of the second substrate. Next, third regions with a third hydrophilic material are defined on the third surface of the third substrate, and one or more regions with the hydrophobic material are defined on the third surface of the third substrate. Furthermore, a liquid is dispensed on the third surface, and the first substrate and the second substrate are placed on the liquid with the first surface facing the third surface and the second surface facing the third surface. After the first substrate and the second substrate have self-aligned relative to the third substrate, the first surface is mechanically coupled to the third surface and the top surfaces of the spacers are mechanically coupled to the third surface, where the thickness of the spacers aligns the first optical waveguide and the second optical waveguide.

Alternatively, in some embodiments the entire first surface is hydrophilic and/or the entire second surface is hydrophilic. Note that the first hydrophilic material, the second hydrophilic material and/or the third hydrophilic material may be the same of different.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Figure 1:
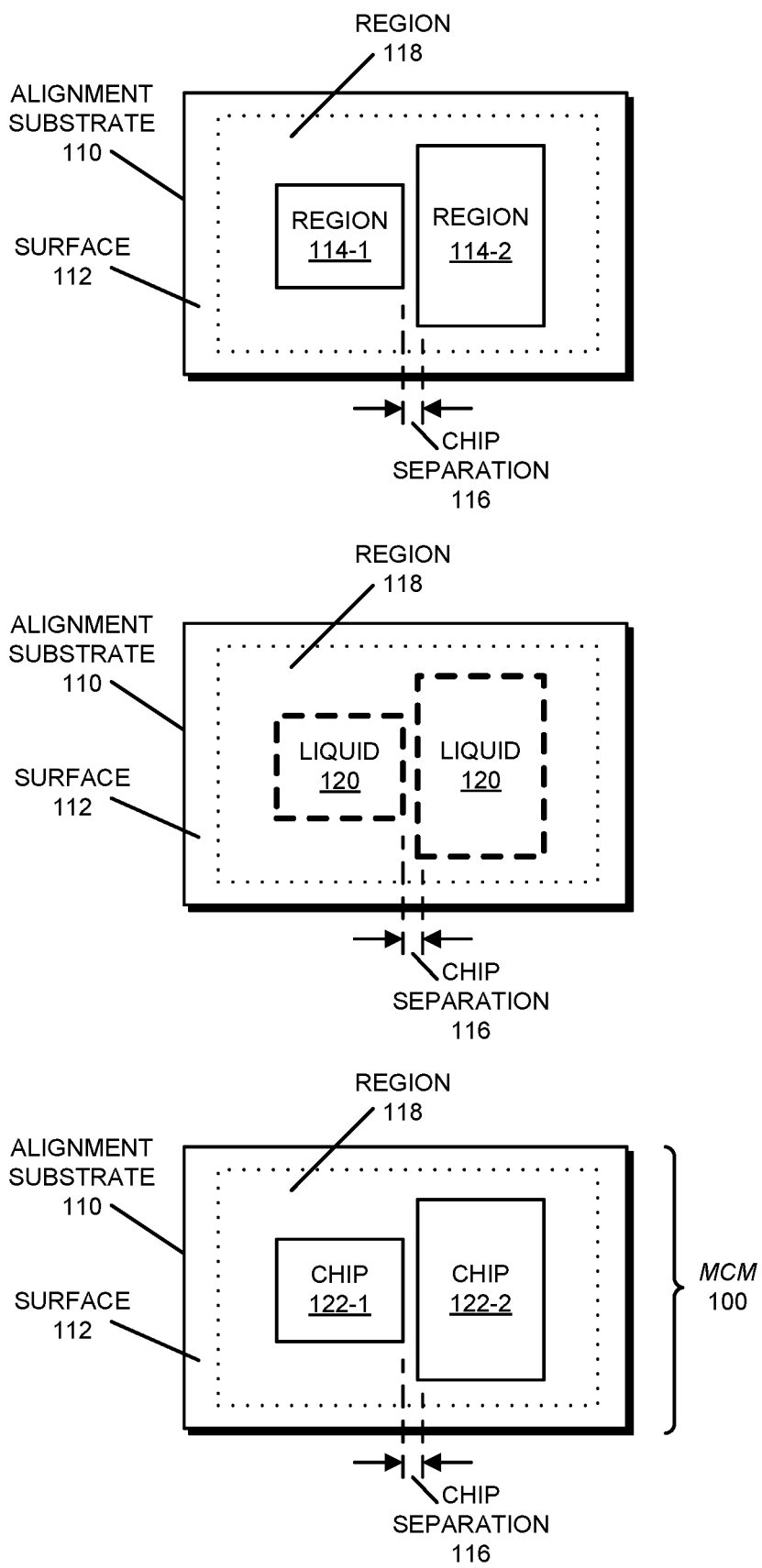
FIG. 1 is a diagram illustrating a top view of fabrication of a multi-chip module (MCM) in accordance with an embodiment of the present disclosure.

Embodiments of a multi-chip module (MCM), a system that includes the MCM, and a technique for fabricating the MCM are described. This MCM includes two substrates that are passively self-assembled on another substrate using hydrophilic and hydrophobic materials on facing surfaces of the substrates and liquid surface tension as the restoring force. In particular, regions with a hydrophilic material on the two substrates overlap regions with the hydrophilic material on the other substrate. These regions on the other substrate may be surrounded by a region with a hydrophobic material. In addition, spacers on a surface of at least one of the two substrates may align optical waveguides disposed on the two substrates, so that the optical waveguides are coplanar. This fabrication technique may allow low-loss hybrid optical sources to be fabricated by edge coupling the two substrates. For example, a first of the two substrates may be a III/V compound semiconductor (with an active optical gain medium) and a second of the two substrates may be a silicon-on-insulator photonic chip.

This fabrication technique may be compatible with high-volume manufacturing. In particular, the hydrophilic and the hydrophobic materials may be fabricated on the surfaces using semiconductor-process techniques. In addition, the fabrication technique may significantly reduce the complexity of alignment in an edge-coupling process, thereby enabling seamless wafer-scale integration. Consequently, the yield of the MCM may be increased, and the cost of the MCM may be significantly reduced.

We now describe embodiments of an MCM and techniques for fabricating the MCM. Low-loss edge coupling of III/V compound-semiconductor optical waveguides with silicon or silicon-on-insulator (SOI) optical waveguides usually involves: optical mode matching, a high-surface quality coupling edge, and accurate optical waveguide alignment. A typical III/V compound-semiconductor optical waveguide has an optical mode size around 1 µm in diameter vertically, which matches neither one of the two popular SOI platforms for silicon photonics, 0.25 to 0.3 µm SOI and 3 µm SOI. Spot-size converters (SSCs) are usually needed on the side with a smaller optical mode size to up-convert the optical mode size to match the other side with the larger optical mode size. In order to integrate a III/V compound-semiconductor active gain medium with a 0.25 to 0.3 µm SOI platform, SSCs are, therefore, typically needed on the SOI side. Moreover, in order to expand the optical mode both laterally and vertically, an SSC using an inverse silicon optical waveguide taper followed with a larger dielectric optical waveguide with a lower index-of-refraction contrast may be used. Furthermore, in order to obtain coupling edges with good surface quality, cleaving or dicing and polishing are often used, which forces integration to be performed on a chip-by-chip basis.

As discussed in "Back-Side Etching and Cleaving of Substrates," by Jin Hyoung Lee, Ivan Shubin, Xuezhe Zheng, and Ashok V. Krishnamoorthy, U.S. patent application Ser. No. 14/024,227, filed on Sep. 11, 2013, the contents of which are herein incorporated by reference, backside-etch assisted cleaving can create a high-quality coupling edge on SOI without the need for polishing. This backside fabrication technique is also a wafer-scale process that allows multiple openings to be created in a single wafer. These openings can be accurately defined by backside photolithography and may be terminated at the SOI optical waveguide facets. The backside fabrication technique, as well as facet polishing and/or facet definition by highly anisotropic dry etching, may be used to fabricate high-quality optical waveguide facets that are used in the fabrication technique described below.

The MCM described herein may integrate three types of chips into a single functional photonic module or transceiver with internally generated laser light (and, more generally, an optical signal). In particular, the MCM may include: a III/V compound-semiconductor optical gain medium chip (such as an optical gain medium chip implemented on an indium phosphide substrate), an external laser cavity photonic SOI chip with or without light-modulating circuits on the silicon substrate, and a data-modulating and laser-driving VLSI chip on a silicon substrate. All three of these chips may be manufactured with different processing technologies, which may not be compatible with each other. Therefore, the disclosed fabrication technique may be a hybrid integration technique that assembles these different chips. The disclosed self-alignment technique may rely on coarse die placement and a droplet self-alignment process driven by the surface tension. These fabrication techniques may be used to achieve chip-to-substrate alignment with high-yield (nearly 100%) and high-precision (sub-micrometer) that may not be possible using only a robotic pick-and-place approach. Moreover, the speed of the hybrid micro-assembly usually depends mostly on the speed of a coarse placement tool. In a recent industrial demonstration of hybrid micro-assembly, a throughput of over 40,000 units has been reported. Therefore, the chips in the disclosed fabrication technique may be placed by an automatic pick-and-place tool at a speed of over 40,000 units per hour, while the surface-tension driven self-alignment occurs after the placement. Note that micron and sub-micron positioning accuracies have been achieved.

The self-alignment may take place as the surface tension minimizes its potential energy, where the gradient of potential is designed to drive the parts (such as the chips in the MCM) toward desired locations. Droplet confinement on patterns on the surfaces of the components in the MCM is often important in self-alignment (it can contribute to the success or failure of droplet self-alignment), and this confinement can typically be achieved on flat and protruded patterns. For a flat pattern, a droplet can be confined on the pattern based on large-wetting contrast between the pattern and substrate. Thus, the patterns for assembly can be flat or protruded. Moreover, the shape of the pattern may match the (micro)chip to be assembled. Confinement of a liquid droplet may be achieved on flat patterns through large-wetting contrast or on protruded patterns with geometrically solid edges. Furthermore, bonding may be achieved by evaporation, curing or thermal compression depending on what kind of liquid and pattern materials are applied. Note that release of a (micro)chip may be difficult in micro-assembly because of scaling laws at microscopic length scales. In particular, the effects of gravity and inertia usually become negligible compared with those of adhesion and friction as the dimensions of the chips decrease from macroscopic to micrometer size. Consequently, the surface tension of the droplet may dominate gravity during the fabrication technique, so surface tension can drive the chips to align with the pattern(s) on the surfaces in the MCM and may prevent the chips from sticking to micro-handling tools.

Furthermore, droplets may be formed with different liquids, such as water, solvents and/or adhesives, thereby providing alternatives for temporary chip-to-substrate placement, as well as for chip permanent attachment. Note that liquid may be applied and droplets can be formed serially by an accurate dispensing tool and/or simultaneously by misting/spraying one or more surface(s) in the MCM, or even by immersing an entire substrate or wafer into an appropriate bath. For example, a hydrophobic surface with significantly decreased wettability can usually be achieved, using a low-surface-energy fluoropolymer coating and/or parylene. Because the low-surface energy fluoropolymer coating may change the chemical composition of a surface, it may make it hard for the water or an adhesive droplet to spread on that surface. Consequently, the droplets may only form in chip-patterned dedicated sites.

Therefore, in the disclosed fabrication technique, multiple chips may simultaneously self-align with respect to each other on a common substrate that has appropriate patterns on its surface. In particular, two chips, a III/V compound-semiconductor optical gain medium die or chip and an SOI external medium die or chip can be self-aligned on the patterned surface of the common substrate by dispensing a calibrated amount of liquid (so that the droplets are confined to the patterned regions on the surface). Note that the common substrate may be a temporary one, as described in "Hybrid Integration of Edge-Coupled Chips," by Xuezhe Zheng, Ivan Shubin, Ying Luo, Guoliang Li, and Ashok V. Krishnamoorthy, U.S. patent application Ser. No. 14/060,136, filed on Oct. 22, 2013, the contents of which are herein incorporated by reference, where a transfer onto a permanent substrate with electrical and thermal provisioning follows. Alternatively, the common substrate may be a permanent-integration platform with a matching electrical interface.

As described further below with reference to FIG. 5, two (or more) arbitrarily structured chips in the MCM may be vertically aligned with each other against a common surface of the temporary or permanent substrate with the help of the vertical spacers built on a top surface of at least one of these chips. These vertical spacers may include conducting (such as metals) or non-conducting (such as polymers, resins, etc.) materials that can be disposed on the top interface of at least the one of the chips to the accurate (correct) thickness using physical deposition or spin coating and subsequent patterning. As a result, the optical waveguides in the chips may be self-aligned in the vertical plane for low-loss optical coupling in the MCM.

Figure 2:
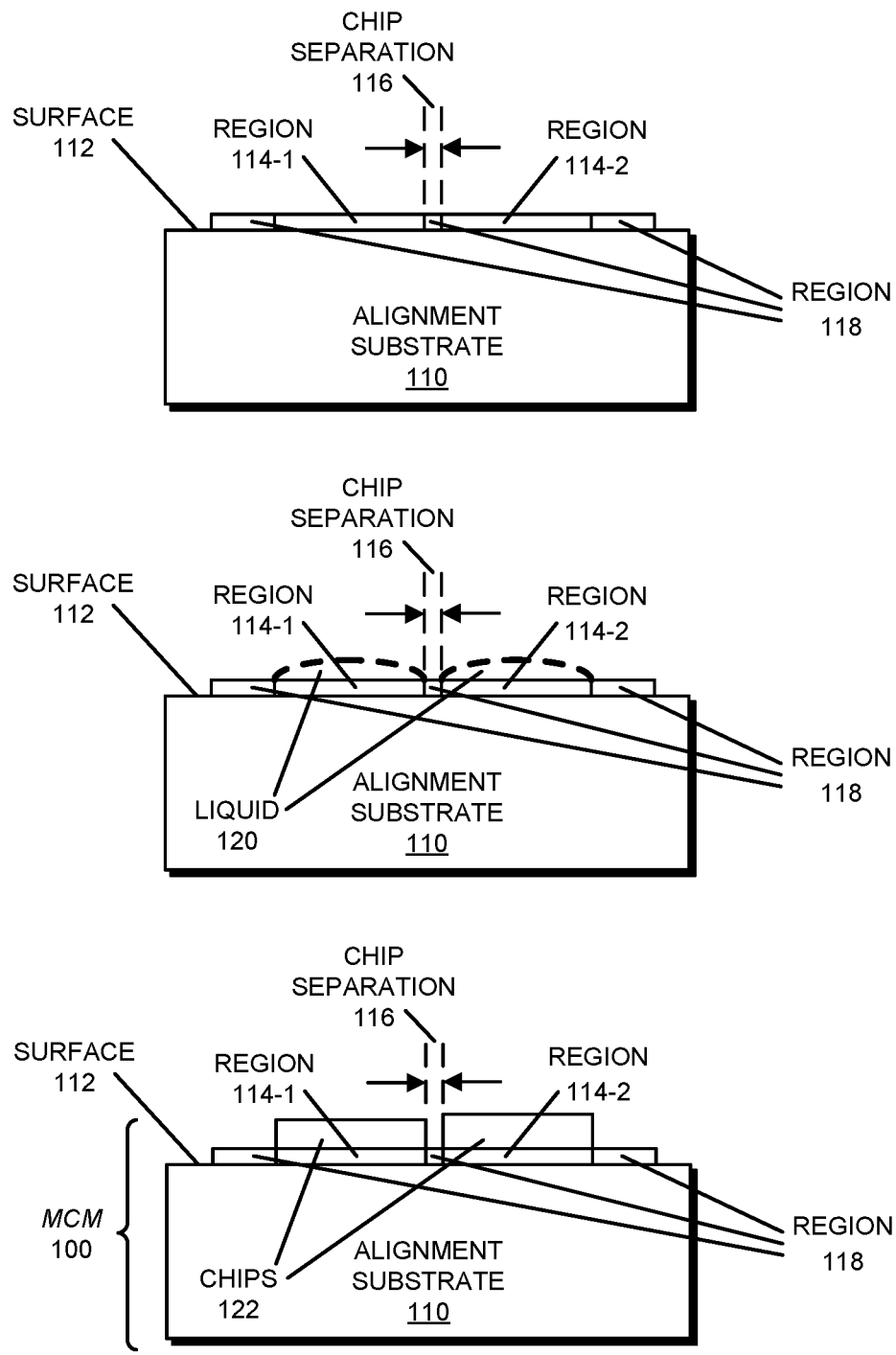
FIG. 2 is a diagram illustrating a side view of fabrication of the MCM in FIG. 1 in accordance with an embodiment of the present disclosure.

The integration operations in the fabrication technique are shown in FIG. 1, which presents a diagram illustrating a top view of fabrication of a multi-chip module (MCM) 100, and FIG. 2, which presents a diagram illustrating a side view of fabrication of MCM 100. In particular, a surface 112 of an alignment substrate 110 may be patterned with chip-specific and chip-sized shapes in order to designate both locations and wettability of the corresponding interfaces. The patterned interfaces in regions 114 may be hydrophilic, and may also have a built-in (by design) chip separation 116. In addition, regions 114 may be surrounded by a region 118 that is hydrophobic.

In an exemplary embodiment, the hydrophilic material includes: a naturally clean silicon oxide (such as silicon dioxide), another oxide, a nitride, and/or a metal (such as aluminum and/or its oxide). Furthermore, the hydrophobic material may include: a silicone (such as poly di-methyl siloxane or PDMS), a fluoropolymer coating (such as a teflon or a material containing carbon-fluoride groups, e.g., $CF_x$), and/or parylene (which may passivate the surface). Alternatively or additionally, a surface may be modified to become hydrophobic and to repel liquids by treating it with hydrogen or oxygen plasma or other chemicals that lower its surface energy.

Note that alignment substrate 110 may be transparent or opaque. A transparent substrate may be beneficial when a UV-curable adhesive is subsequently applied into regions 114 and exposed through its backside for curing. Alternatively, an opaque substrate may be used when alignment substrate 110 is a permanent substrate or an interposer that includes other structures or devices.

Then, an appropriate liquid 120 (water, solvent and/or adhesive) may be dispensed onto alignment substrate 110 or into regions 114. The amount of this liquid may be specified in an automated, calibrated and accurate serial dispense operation or a wafer-level parallel application by misting, spin coating and/or immersion into a bath. Droplets of appropriate volume and size may be formed as a result in regions 114, which accept liquid 120 for self-aligning the chips.

Next, chips 122 to be paired up and aligned may be coarsely positioned by a pick-and-place tool and may be released face-down into the droplets one at the time. Liquid surface tension then aligns them with respect to alignment substrate 110 and, ultimately, with respect to each other laterally and angularly. The common plane of surface 112 of alignment substrate 110 may ensure vertical self-alignment.

Figure 3:
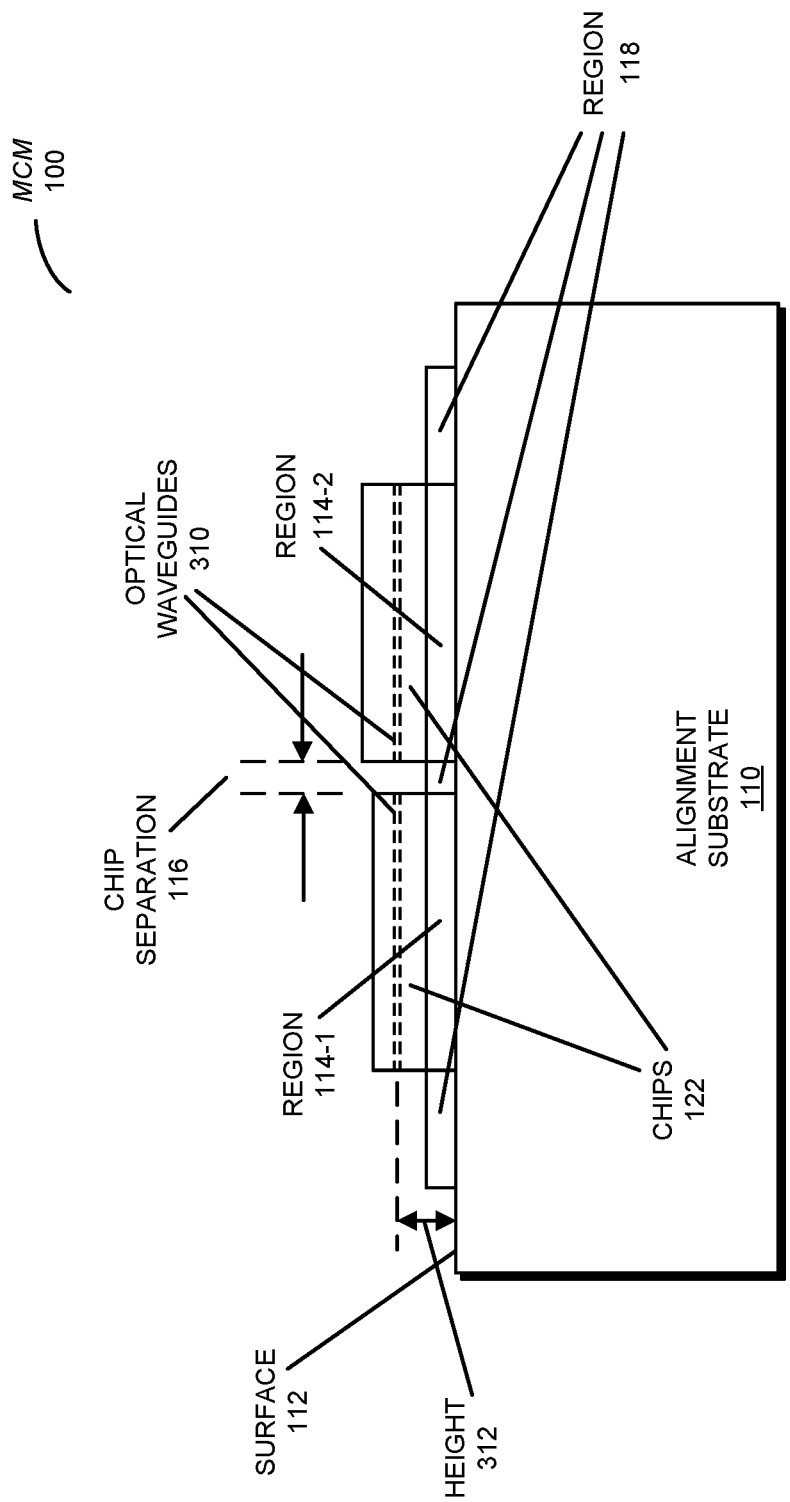
FIG. 3 is a block diagram illustrating a side view of the MCM of FIG. 1.

Note that self-alignment using liquid surface tension may be relatively fast. In particular, if liquid 120 is an adhesive it can be cured at this point to lock chips 122 in the aligned positions. For example, depending on its nature, adhesive can be cured with temperature or UV light, for both temporary and permanent use. (Thus, in some embodiments, the mechanical coupling between chips 122 and alignment substrate 110 may be remateable, which may allow the MCM to be reworked.) If temporary, the aligned chips 122 may be further transferred onto a permanent substrate in a fashion similar to that described in "Hybrid Integration of Edge-Coupled Chips," by Xuezhe Zheng, Ivan Shubin, Ying Luo, Guoliang Li, and Ashok V. Krishnamoorthy, U.S. patent application Ser. No. 14/060,136, filed on Oct. 22, 2013. Moreover, note that the entire assembly sequence may be wafer-scale applicable. Furthermore, as shown in FIG. 3, which presents a block diagram illustrating a side view of an MCM 100, each aligned chip pair (such as chips 122) may contain one or more aligned and coupled optical-waveguide sets, such as optical waveguides 310, which are a common height 312 from surface 112.

Figure 4:
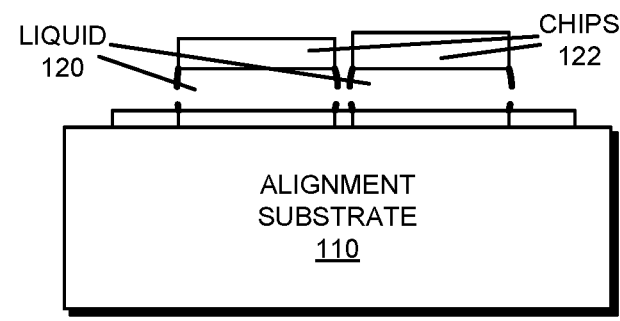
FIG. 4 is a diagram illustrating a side view of fabrication of an MCM in accordance with an embodiment of the present disclosure.
Figure 4:
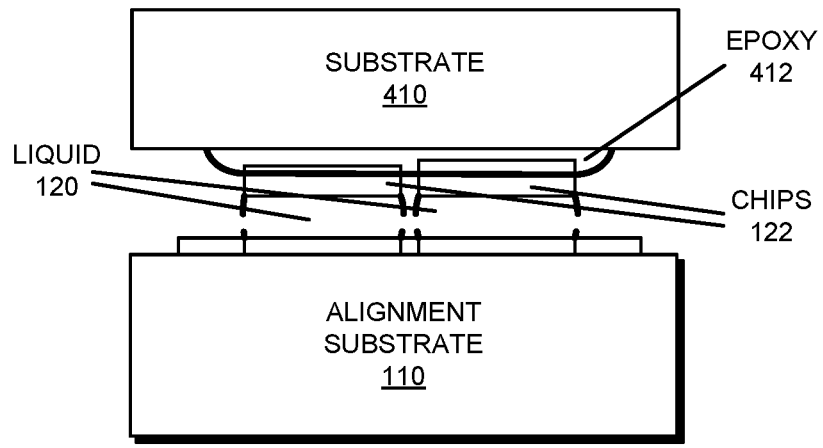
Figure 4:
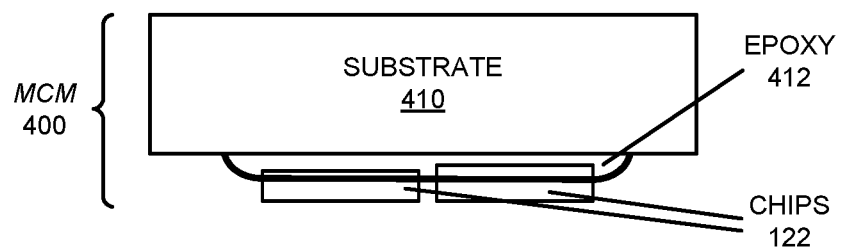

The transfer of aligned chips 122 from alignment substrate 110 to a substrate 410 during the fabrication technique is shown in FIG. 4, which presents a diagram illustrating a side view of fabrication of an MCM 400. Note that chips 122 may be mechanically coupled to substrate 410 using epoxy 412. Then, chips 122 may be mechanically decoupled from alignment substrate 110.

As noted previously, the fabrication technique may be used to vertically align chips having different structures. In particular, optical waveguides in SOI and III/V compound-semiconductor chips may not be aligned vertically because of their vastly different fabrication techniques. FIG. 3 demonstrates schematically what two such different chips look like when their optical waveguides 310 are matched vertically for the best optical coupling. However, if the top surfaces of chips 122 are not in the same plane, the detailed self-alignment sequence in the fabrication technique may not bring chips 122 into the complete six-axis alignment.

Figure 5:
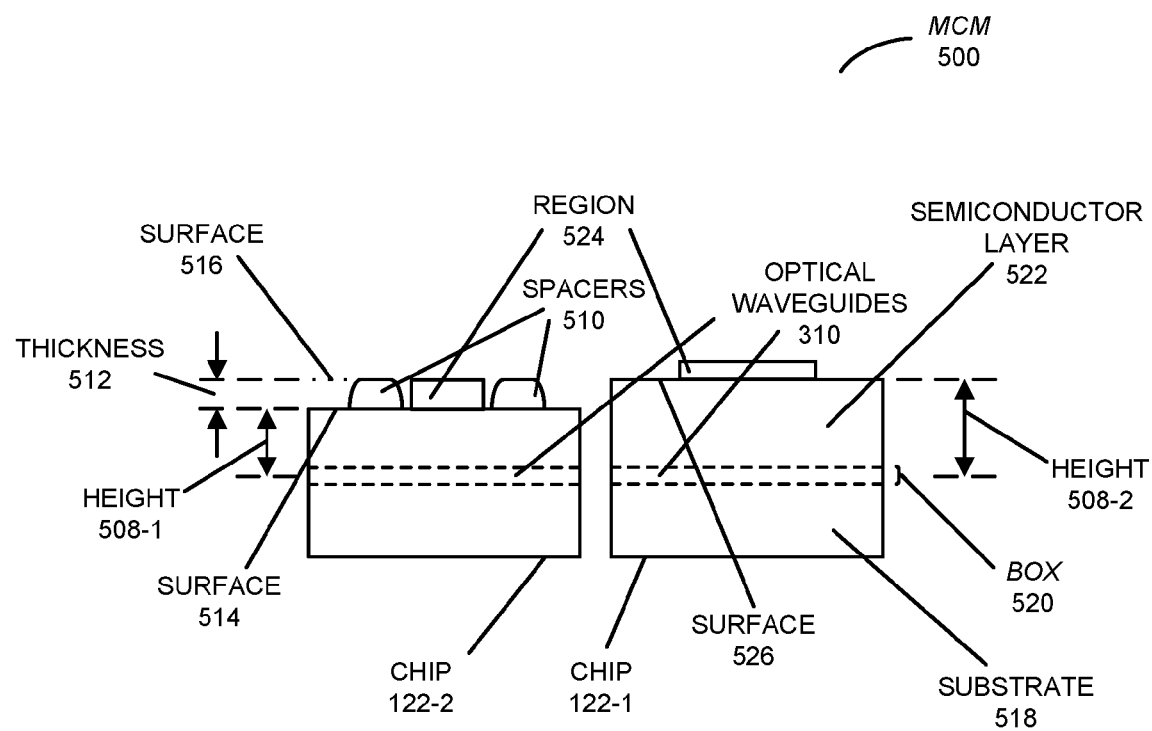
FIG. 5 is a diagram illustrating a side view of leveling of chips in an MCM using spacers in accordance with an embodiment of the present disclosure.

As shown in FIG. 5, which is a diagram illustrating a side view of leveling of chips in an MCM 500, by integrating spacers 510 of appropriate thickness 512 (equal to a difference between heights 508) on at least one of surfaces 514 of chip 122 (such as the surface of chip 122-1 or, alternatively, the surface of chip 122-2), optical waveguides 310 may be aligned vertically by setting chips 122 against a common interface or surface (illustrated by dashed line 516) of the alignment substrate. These spaces may include electrical pads on their top surfaces. Using spacers 510, the described chip-to-chip fabrication technique can be used to ensure self-alignment in all the degrees of freedom.

Note that chip 122-2 in FIG. 5 may be an SOI photonic chip. Therefore, chip 122-2 may include: silicon substrate 522; a buried-oxide layer (BOX) 520 disposed on silicon substrate 522; and a semiconductor (silicon) layer 518 disposed on buried-oxide layer 520, where the optical waveguide is defined in semiconductor layer 518.

In addition, note that regions 524 on surfaces 514 and 526 may be hydrophilic. Regions 524 may be matched in size and location to corresponding hydrophilic region on a third substrate.

Furthermore, note that chips 122 may not have the same thickness. Differences in thickness may be corrected by a sufficiently thick epoxy 412 (FIG. 4) applied to their back surfaces.

Figure 6:
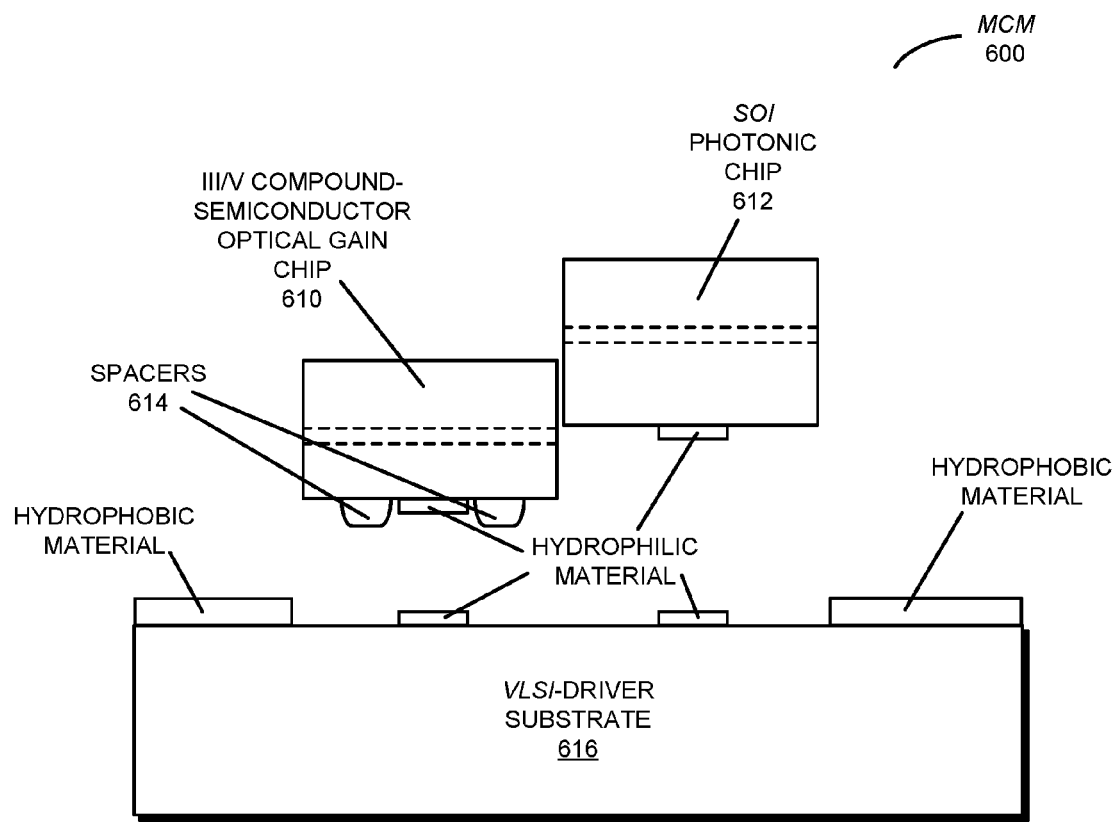
FIG. 6 is a diagram illustrating a side view of fabrication of an MCM in accordance with an embodiment of the present disclosure.

In an exemplary embodiment, the integration configuration targeted by the self-alignment is a three-chip assembled module containing a III/V compound-semiconductor light source, light-modulating 501 circuits with an external optical cavity, data-coding VLSI circuit and/or optical input/output (such as an optical fiber connector). This MCM may provide a hybrid-integrated fully functional transceiver. FIG. 6 presents a diagram illustrating a side view of fabrication of an MCM 600 with: a III/V compound-semiconductor optical gain chip 610, SOI photonic chip 612, optical waveguide leveling spacers 614, and a matching set of electrical pads on facing top surfaces of III/V compound-semiconductor optical gain chip 610, SOI photonic chip 612 and VLSI-driver substrate 616 (which acts as a permanent active substrate or interposer chip). Note that in some embodiments the matching set of electrical pads is included within or on the patterned regions with the hydrophilic material.

Figure 7:
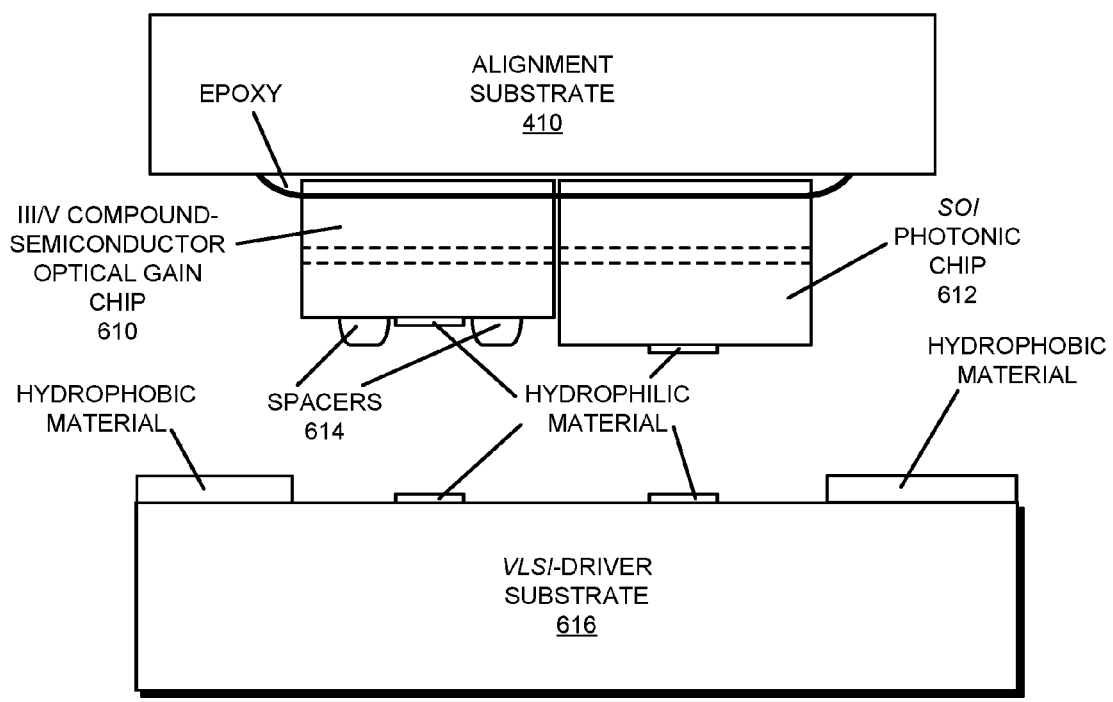
FIG. 7 is a diagram illustrating a side view of fabrication of an MCM in accordance with an embodiment of the present disclosure.

Another example of the optical transceiver integration with an internal light source when the self-alignment is carried out on alignment substrate 410 for further integration with VLSI-driver substrate 616 is shown in FIG. 7, which presents a diagram illustrating a side view of fabrication of an MCM 700. Note that alignment substrate 110 was used previously for temporary alignment prior to the transfer over to alignment substrate 410 for mounting onto VLSI-driver substrate 616. Thus, FIG. 7 illustrates MCM 400 (FIG. 4) self-aligned (or flip-chip-tool aligned) onto VLSI-driver substrate 616.

Figure 8:
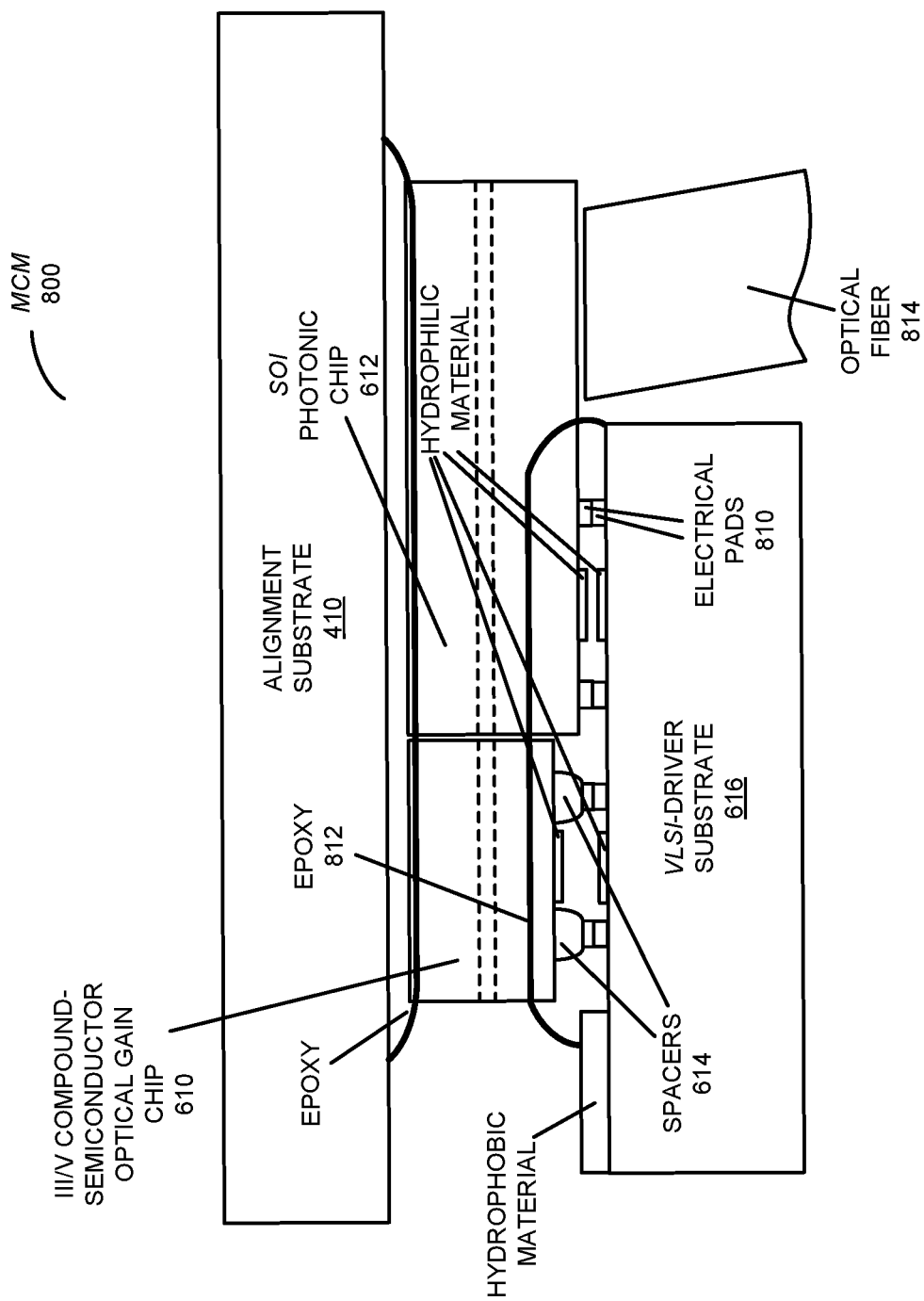
FIG. 8 is a diagram illustrating a side view of an MCM in accordance with an embodiment of the present disclosure.

A schematic view of the complete three-chip module is shown in FIG. 8, which presents a diagram illustrating a side view of an MCM 800. In particular, a matching set of electrical pads (such as electrical pads) 810 may power up and provide data to the 501 photonic chip 612, and may drive current through III/V compound-semiconductor optical gain chip 610. Note that permanent adhesive (such as epoxy 812) may be used in order to secure the aligned assembly. Additionally, a compete module may have a portion of the 501 photonic chip exposed in another post-processing operation in order to gain access to the optical input/output elements for optical coupling to optical fiber 814.

As noted previously, MCM 800 may be assembled, in part, using high-precision pick-and-place or flip-chip bonding equipment. This equipment may align the optical waveguides in both chips with high- and sufficient-accuracy to ensure a uniform bondline with respect to the VSLI active interposer or the VLSI chip. However, in other embodiments the self-alignment is purely passive, i.e., without pick-and-place or flip-chip bonding equipment. In addition, the fabrication technique may be used with individual chips or in wafer-scale integration.

In an exemplary embodiment, spacers on one or more of the surfaces may be used, during self-alignment, to put the optical waveguides in different chips in the same plane. This self-alignment may be performed using a temporary self-alignment substrate, which has the third surface. Hydrophilic regions may be defined on the first surface, the second surface and the third surface. In some embodiments, the hydrophilic and the hydrophobic regions may be defined using a single patterning operation. For example, the first surface, the second surface and the third surface may be first blanket treated so that they are hydrophilic, and then these surfaces may be patterned with a hydrophobic material. This region patterning may be performed very accurately with submicron accuracy in terms of both registration (location) and region dimensions (size). This approach may allow the accuracy of the self-alignment to be on the same order. In particular, the region patterning may have an accuracy of 0.25 μm for both registration and region dimensions. In general, the first and second hydrophilic surfaces may be registered and sized to match hydrophilic areas on the third surface. As the liquid is dispensed, the chips may be coarsely dropped and self-aligned. This structure may be locked or tacked when the liquid either evaporates or is temporarily cured. Then, the structure may be mechanically coupled to a permanent substrate (such as substrate 410 in FIG. 4) using a permanently cured epoxy such as epoxy 412 in FIG. 4), and the temporarily cured liquid used for self-alignment may be dissolved. Next, the resulting MCM (such as MCM 400 in FIG. 4) may be flip chip onto a VLSI substrate (such as VLSI-driver substrate 616 in FIG. 6) while electrically connecting the chips and the VLSI substrate using a matching set of electrical pads (which, as shown in FIG. 8, may be on top of the spacers, but can be located elsewhere on the surfaces). As noted previously, if the chips do not have the same thickness (which is often hard to ensure), the difference in their thicknesses may be absorbed by the cured and hardened epoxy.

Thus, while FIG. 6 illustrates attaching one chip at a time onto VLSI-driver substrate 616, in FIGS. 7 and 8 chips 610 and 612 may be self-aligned onto substrate 410 and flip-chip binding equipment is used to attach an entire assembly (such as MCM 400 in FIG. 4) onto VLSI-driver substrate 616 with reduced accurate and less expensive assembly tooling. Alternatively, the entire assembly may also be self-aligned onto VLSI-driver substrate 616. Therefore, regions 526 in FIG. 5 may or may not be hydrophilic, and the hydrophilic and hydrophobic materials in FIGS. 7 and 8 may or may not be needed.

Figure 9:
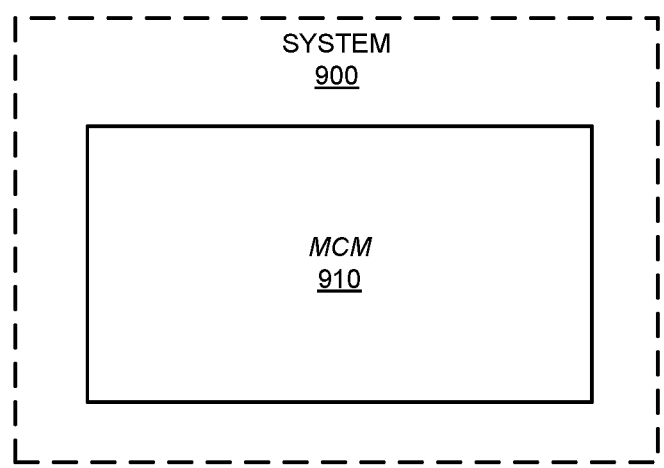
FIG. 9 is a block diagram illustrating a system in accordance with an embodiment of the present disclosure.

One or more of the preceding embodiments of the MCM may be included in a system and/or an electronic device. This is shown in FIG. 9, which presents a block diagram illustrating a system 900 that includes MCM 910. In general, an MCM may include an array of chip modules (CMs) or single-chip modules (SCMs), and a given SCM may include at least one substrate, such as a semiconductor die. Note that an MCM is sometimes referred to as a 'microchip.' Furthermore, the substrate may communicate with other substrates, CMs and/or SCMs in the MCM using proximity communication of electromagnetically coupled signals (which is referred to as 'electromagnetic proximity communication'). For example, the proximity communication may include: communication of capacitively coupled signals ('electrical proximity communication') and/or communication of optical signals (such as 'optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that system 900 may include, but is not limited to: a server, a laptop computer, a communication device or system, a personal computer, a tablet, a cellular telephone, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCMs in the preceding embodiments may include fewer components or additional components. Furthermore, although these embodiments are illustrated as having a number of discrete items, these MCMs and systems are intended to be functional descriptions of the various features that may be present rather than structural schematics of the embodiments described herein. Consequently, in these embodiments two or more components may be combined into a single component, and/or a position of one or more components may be changed.

Note that components in MCM 910 may be defined using an additive process (i.e., material deposition) and/or a subtractive process (i.e., material removal). For example, the process may include: sputtering, isotropic etching, anisotropic etching, a photolithographic technique and/or a direct-write technique. Additionally, these features may be fabricated using a wide variety of materials, including: a semiconductor, metal, glass, sapphire, silicon dioxide, organic materials, inorganic materials, a resin and/or polymers.

Figure 10:
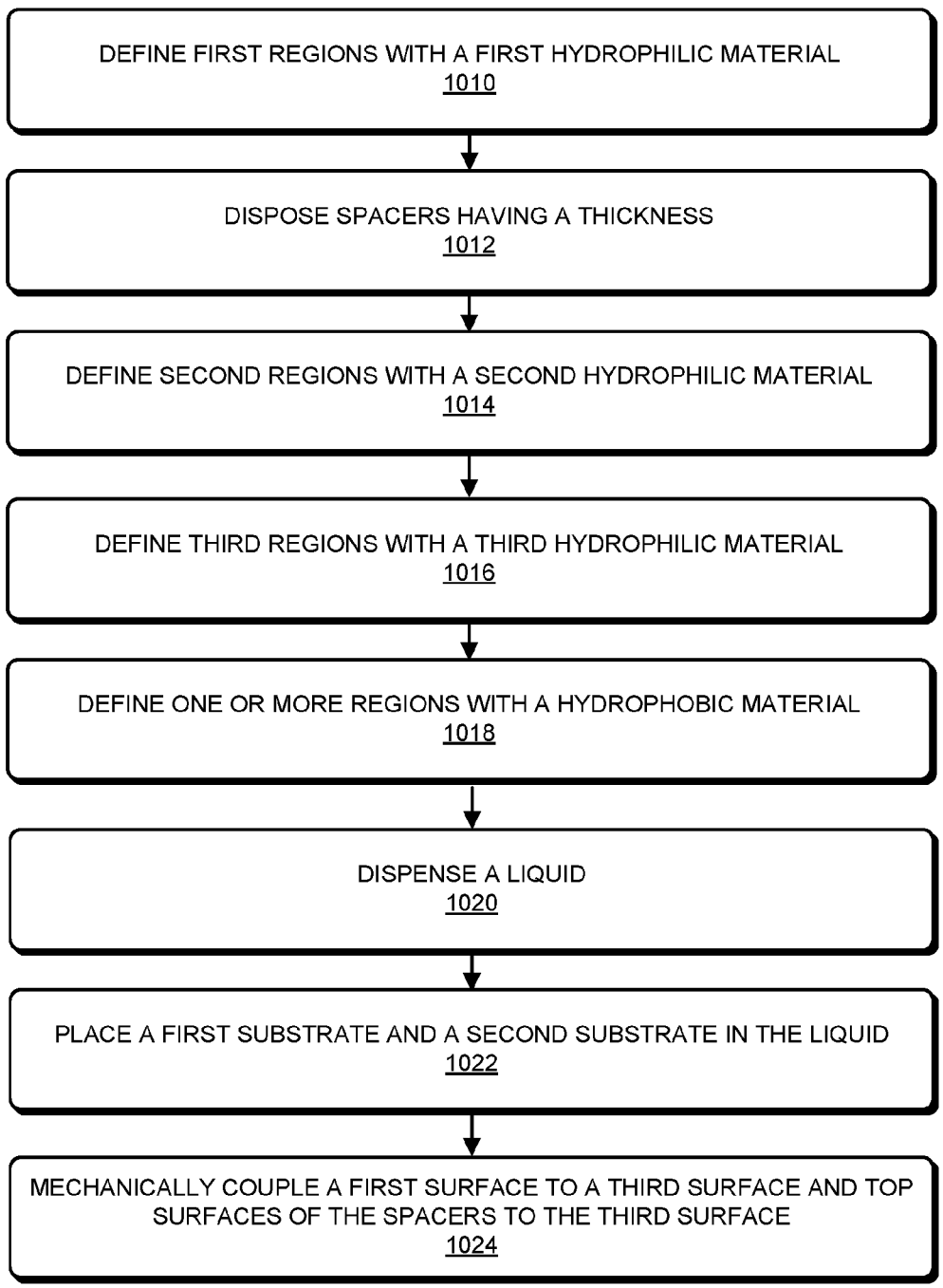
FIG. 10 is a flow chart illustrating a method for fabricating an MCM in accordance with an embodiment of the present disclosure.

We now describe embodiments of a method. FIG. 10 presents a flow chart illustrating a method 1000 for fabricating an MCM, such as MCM 100 in FIG. 3 During this method, first regions are defined with a first hydrophilic material (operation 1010) on a first surface of a first substrate, where the first substrate includes a first optical waveguide disposed on the first substrate at a first height relative to the first surface. Then, spacers, which have a thickness, are disposed (operation 1012) on a second surface of a second substrate, where the second substrate includes a second optical waveguide disposed on the second substrate at a second height relative to the second surface. Moreover, second regions with a second hydrophilic material (which may be the same or different than the first hydrophilic material) are defined (operation 1014) on the second surface of the second substrate. Next, third regions with the hydrophilic material (which may be the same or different than the first hydrophilic material and/or the second hydrophilic material) are defined (operation 1016) on a third surface of a third substrate, and one or more regions with a hydrophobic material are defined (operation 1018) on the third surface of the third substrate. Note that the third regions may be matches in location and size to the corresponding first regions and the second regions. Furthermore, a liquid is dispensed (operation 1020) on the third surface, and the first substrate and the second substrate are placed on the liquid (operation 1022) with the first surface facing the third surface and the second surface facing the third surface. After the first substrate and the second substrate have self-aligned relative to the third substrate, the first surface is mechanically coupled to the third surface and the top surfaces of the spacers are mechanically coupled to the third surface (operation 1024), where the thickness of the spacers aligns the first optical waveguide and the second optical waveguide.

Note that the spacers may be thin, such as having thicknesses of at most several micrometers. As such, the spacers may not interfere with the hydrophilic-area patterning or the self-alignment. For example, there may be three or four spacers per chip and their area may be small such that their hydrophilic behavior may not impact the self-alignment or the area on the chip surface needed for self-alignment.

In some embodiments of method 1000, there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A method for fabricating an MCM, comprising:
    defining first regions with a first hydrophilic material on a first surface of a first substrate, wherein the first substrate includes a first optical waveguide disposed on the first substrate at a first height relative to the first surface;
    disposing spacers, which have a thickness, on a second surface of a second substrate, wherein the second substrate includes a second optical waveguide disposed on the second substrate at a second height relative to the second surface;
    defining second regions with a second hydrophilic material on the second surface;
    defining third regions with a third hydrophilic material on a third surface of a third substrate;
    defining one or more regions with a hydrophobic material on the third surface of the third substrate;
    dispensing a liquid on the third surface;
    placing the first substrate and the second substrate on the liquid with the first surface facing the third surface and the second surface facing the third surface; and
    after the first substrate and the second substrate have self-aligned relative to the third substrate, mechanically coupling the first surface to the third surface and the top surfaces of the spacers to the third surface, wherein the thickness of the spacers aligns the first optical waveguide and the second optical waveguide.

2. The method of claim 1, wherein the first substrate includes a semiconductor optical amplifier defined in a semiconductor other than silicon.

3. The method of claim 1, wherein the second substrate includes a photonic chip.

4. The method of claim 3, wherein the photonic chip includes:
    the second substrate;
    a buried-oxide layer disposed on the second substrate; and
    a semiconductor layer disposed on the buried-oxide layer, wherein the second optical waveguide is defined in the semiconductor layer.

5. The method of claim 1, wherein the second substrate, the buried-oxide layer and the semiconductor layer constitute a silicon-on-insulator technology.

6. The method of claim 1, wherein back surfaces of the first substrate and the second substrate, which are on opposite sides of the first substrate and the second substrate from the first surface and the second surface, include a hydrophilic material.

7. The method of claim 1, wherein the first surface and the third surface include facing regions with a hydrophilic material.

8. The method of claim 7, wherein the third surface includes regions with a hydrophobic material that are outside of an area of overlap between the first surface and the third surface.

9. The method of claim 8, wherein the hydrophobic material includes one of: a fluoropolymer, and parylene.

10. The method of claim 8, wherein the hydrophobic material is fabricated using a plasma treatment with oxygen.

11. The method of claim 1, wherein the second surface and the third surface include facing regions with a hydrophilic material.

12. The method of claim 11, wherein the third surface includes regions with a hydrophobic material that are outside of an area of overlap between the top surfaces of the spacers and the third surface.

13. The method of claim 12, wherein the hydrophobic material includes one of: a fluoropolymer, and parylene.

14. The method of claim 12, wherein the hydrophobic material is fabricated using a plasma treatment with oxygen.

15. The method of claim 1, wherein the MCM further includes an epoxy layer between an area of overlap between the first surface and the third surface, and between an area of overlap between the second surface and the third surface.

16. The method of claim 1, wherein the spacers include one of: a metal, a polymer and a resin.

17. The method of claim 1, wherein the first height equals a sum of the second height and the thickness of the spacers.

* * * * *

UNITED STATES PATENT AND TRADEMARK OFFICE
CERTIFICATE OF CORRECTION

PATENT NO.         : 9,519,105 B1                                Page 1 of 1
APPLICATION NO.    : 15/188403
DATED              : December 13, 2016
INVENTOR(S)        : Shubin et al.

It is certified that error appears in the above-identified patent and that said Letters Patent is hereby corrected as shown below:

In the Specification

In Column 8, Line 62, delete "501" and insert -- SOI --, therefor.

In Column 9, Line 25, delete "501" and insert -- SOI --, therefor.

In Column 9, Line 30, delete "501" and insert -- SOI --, therefor.

In Column 10, Line 2, delete "such" and insert -- (such --, therefor.

In Column 10, Line 32, delete "'microchip.'" and insert -- 'macrochip.' --, therefor.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*